(12) United States Patent
Chang et al.

(10) Patent No.: US 10,861,761 B2
(45) Date of Patent: Dec. 8, 2020

(54) SEMICONDUCTOR PACKAGED WAFER AND METHOD FOR FORMING THE SAME

(71) Applicant: TAIWAN SEMICONDUCTOR MANUFACTURING COMPANY LTD., Hsinchu (TW)

(72) Inventors: Fu-Chen Chang, Hsinchu (TW); Cheng-Lin Huang, Hsinchu (TW); Wen-Ming Chen, Miaoli County (TW); Shih-Yen Chen, Hsinchu (TW); Ruei-Yi Tsai, Chiayi (TW); Pin-Yi Hsin, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/901,333

(22) Filed: Feb. 21, 2018

(65) Prior Publication Data
US 2019/0103389 A1 Apr. 4, 2019

Related U.S. Application Data

(60) Provisional application No. 62/566,098, filed on Sep. 29, 2017.

(51) Int. Cl.
*H01L 23/31* (2006.01)
*H01L 21/56* (2006.01)
(Continued)

(52) U.S. Cl.
CPC .......... *H01L 23/3135* (2013.01); *H01L 21/56* (2013.01); *H01L 21/565* (2013.01); *H01L 23/10* (2013.01); *H01L 21/568* (2013.01); *H01L 25/0652* (2013.01); *H01L 25/0655* (2013.01); *H01L 25/50* (2013.01)

(58) Field of Classification Search
CPC ..... H01L 21/52; H01L 21/565; H01L 21/568; H01L 23/28; H01L 23/31; H01L 23/3107; H01L 23/3114; H01L 23/3121; H01L 23/3192; H01L 23/3142; H01L 23/31241;
(Continued)

(56) References Cited

U.S. PATENT DOCUMENTS

| | | | | |
|---|---|---|---|---|
| 7,033,857 B2 * | 4/2006 | Munakata | ............. | H01L 21/561 438/106 |
| 7,709,295 B2 * | 5/2010 | Fujimura | ............. | H01L 21/304 257/E21.459 |

(Continued)

*Primary Examiner* — David A Zarneke
(74) *Attorney, Agent, or Firm* — WPAT, P.C., Intellectual Property Attorneys; Anthony King

(57) ABSTRACT

Present disclosure provides a method for forming a semiconductor packaged wafer, including providing a semiconductor package having a die on a first side of a wafer, partially molding the die by disposing molding material on the first side of the wafer, a peripheral of the first side is free of molding material at a completion of the partially molding, and bonding the semiconductor package with a carrier from the first side of the wafer. Present disclosure also provides a semiconductor packaged wafer, including a die on a first side of a wafer, a molding encapsulating the die and partially positioning on the first side of the wafer by retracting from a peripheral of the first side of the wafer, and a sealing structure on the peripheral of the first side of the wafer.

20 Claims, 21 Drawing Sheets

(51) Int. Cl.
*H01L 23/10* (2006.01)
*H01L 25/00* (2006.01)
*H01L 25/065* (2006.01)

(58) Field of Classification Search
CPC ............. H01L 23/3135; H01L 23/3157; H01L 21/6836; H01L 2221/68327
See application file for complete search history.

(56) References Cited

U.S. PATENT DOCUMENTS

| | | | |
|---|---|---|---|
| 8,158,046 B2* | 4/2012 | Brunnbauer | B29C 45/14639 264/272.17 |
| 8,420,450 B2* | 4/2013 | Ko | H01L 21/565 257/667 |
| 8,466,040 B2* | 6/2013 | Park | H01L 27/14683 438/458 |
| 8,604,615 B2* | 12/2013 | Lee | H01L 25/0657 257/737 |
| 8,748,307 B2* | 6/2014 | Hirschler | H01L 21/76898 257/E21.214 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,419,156 B2* | 8/2016 | Lee | H01L 23/48 |
| 9,425,126 B2 | 8/2016 | Kuo et al. | |
| 9,443,783 B2 | 9/2016 | Lin et al. | |
| 9,490,170 B2* | 11/2016 | Tomono | H01L 21/6835 |
| 9,496,189 B2 | 11/2016 | Yu et al. | |
| 9,496,229 B2* | 11/2016 | Rogers | H01L 21/31111 |
| 9,595,463 B2* | 3/2017 | Priewasser | H01L 21/6836 |
| 9,676,114 B2* | 6/2017 | Kuo | B26D 7/18 |
| 9,842,811 B1* | 12/2017 | Chou | H01L 23/49822 |
| 9,865,566 B1* | 1/2018 | Yu | H01L 25/50 |
| 9,881,814 B2* | 1/2018 | Cheon | H01L 21/565 |
| 9,892,986 B2* | 2/2018 | Koshimizu | H01L 21/782 |
| 10,014,260 B2* | 7/2018 | Tsai | H01L 21/4853 |
| 10,269,639 B2* | 4/2019 | Koshimizu | H01L 21/78 |
| 10,373,888 B2* | 8/2019 | Li | H01L 23/3142 |
| 10,727,198 B2* | 7/2020 | Hsu | H01L 24/19 |
| 2015/0236003 A1* | 8/2015 | Konno | H01L 21/486 438/107 |
| 2016/0111581 A1* | 4/2016 | Prajuckamol | H01L 21/31053 257/676 |
| 2017/0076984 A1* | 3/2017 | Onodera | H01L 21/3083 |
| 2017/0365581 A1* | 12/2017 | Yu | H01L 25/0655 |
| 2019/0006291 A1* | 1/2019 | Neal | H01L 25/50 |

* cited by examiner

SEMICONDUCTOR PACKAGED WAFER AND METHOD FOR FORMING THE SAME

CROSS REFERENCE TO RELATED APPLICATIONS

This application claims the benefit of prior-filed provisional application No. 62/566,098, filed Sep. 29, 2017.

BACKGROUND

Since the invention of the integrated circuit, the semiconductor industry has experienced continued rapid growth due to continuous improvements in the integration density of various electronic components (i.e., transistors, diodes, resistors, capacitors, etc). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

In an attempt to further increase circuit density, three-dimensional (3D) integrated circuits (ICs) have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Advances have also been made in wafer-level packaging. Generally, wafer-level packaging involves performing back-end-of-line processing at the wafer level as opposed to performing this processing after the wafer has been diced. In particular, wafer-level packaging may include forming contact structures, encapsulating or back-side protection, grinding, and the like at the wafer level. It has been found that performing these functions at the wafer level may decrease costs. Wafer-level packaging may also result in thinner packages.

After packaging, the wafer is separated into individual dice. Typically, however, wafer-level package techniques place a molding or encapsulant compound on its upper surface, leaving the edges of the wafer exposed. As a result, the wafer may be susceptible to damage and/or wafer warping

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1:
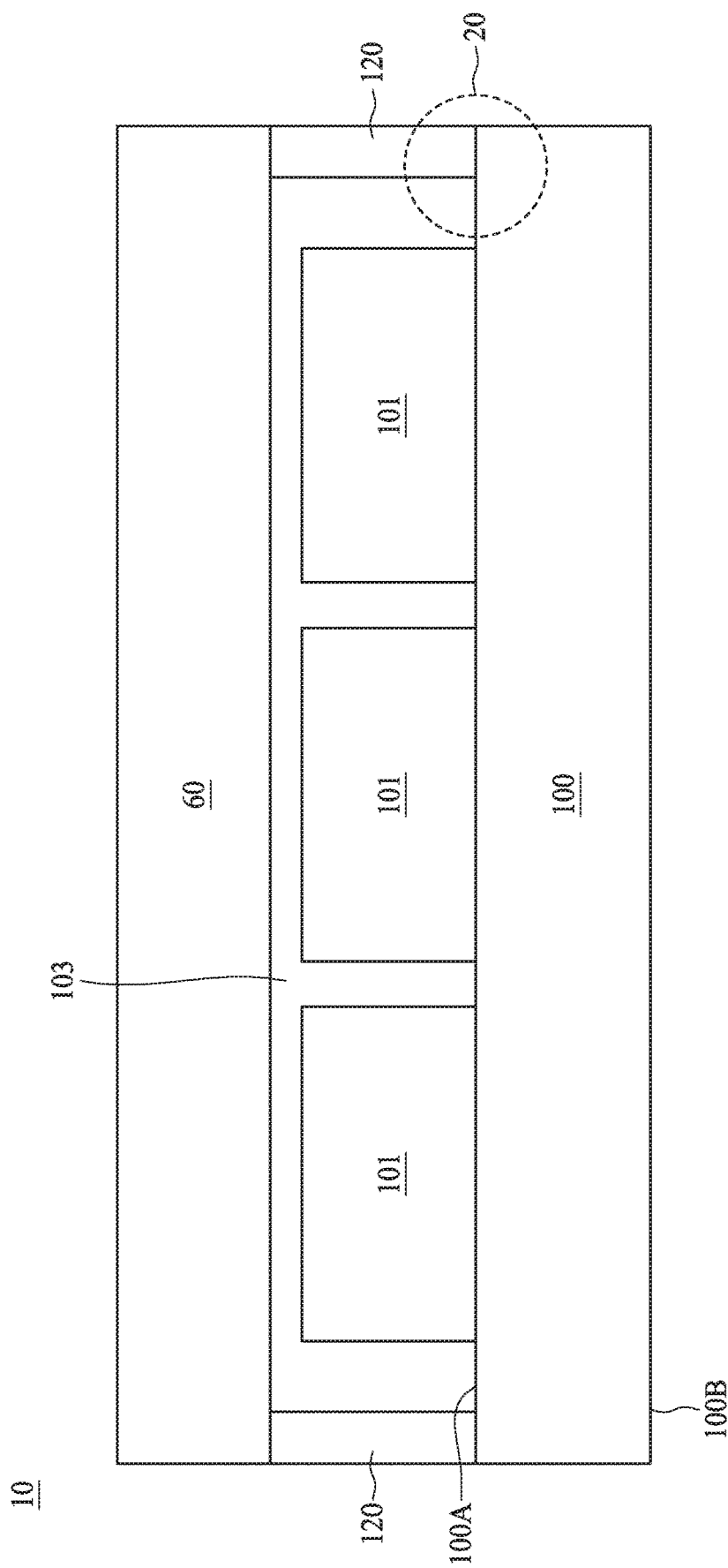
FIG. 1 is a cross sectional view of a semiconductor packaged wafer, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts, in the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

The present disclosure describes embodiments with respect to a specific context, namely, a method and an apparatus for performing die-to-wafer level packaging. Other embodiments, however, may be used in other contexts, such as wafer-level packaging, die-to-die packaging, wafer-to-wafer packaging, and the like.

Conventionally, wafer-level full molding involves forming molding compound not only on the die side or the first side of the wafer but also on the peripheral of second side (opposite to the first side) of the wafer. The molding coverage at the second side of the wafer usually called molding residue and requires subsequent operations to remove such molding residue by trimming the portion of the wafer bearing the molding residue from the second side. In order to control the accompanying total thickens variation (TTV) of the processing wafer, the trimming operation is usually conducted to completely remove the molding residue from the second side, which may have a thickness of about 15-20 micrometers, and further remove the molding residue-bearing portion of the wafer by about 15 micrometers. Other consequence of ill-controlled TTV may cause the through silicon via formed at later operations to demonstrate incomplete exposure at the second side of the wafer, thereby jeopardizing the reliability of interconnection structure.

After the trimming operation conducted at the peripheral of the wafer, the mechanical strength of the wafer at the very location is seriously deteriorated especially when the molding is partially removed at the periphery due to carrier removal. Therefore, subsequent wafer handling (e.g., wafer trimming, molding grinding, wafer bonding, etc) often causes wafer chipping at the periphery because the periphery usually remains a thin layer of about 100 micrometer thick wafer without any mechanical supports from molding materials.

It is thus undesired to continue using the wafer-level full molding which covers periphery at the second side of the wafer. Present disclosure provides a method for manufacturing a semiconductor packaged wafer which involves a partial molding, instead of a full molding, that covers only the first side of the wafer. In some embodiments, the partial molding on the first side of the wafer retracted from the sidewall of the wafer by a predetermined distance, thereby creating a periphery at the first side uncovered by molding materials. Present disclosure also provides a structure utilizing partial molding to achieve a core-shell molding structure at the first side of the wafer.

In some embodiments, the present disclosure will be described with respect to embodiments in a specific context, namely a Chip on Wafer on Substrate (CoWoS) device. The disclosure may also be applied, however, to other integrated circuits, electronic structures, and the like.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be preformed on intermediate structures as well as the final structure. Additionally, the structures and methods disclosed herein may be used in conjunction with testing methodologies that incorporate intermediate verification of known good dies to increase the yield and decrease costs.

Referring to FIG. 1, FIG. 1 is a cross sectional view of a semiconductor packaged wafer 10, in accordance with some embodiments of the present disclosure. A semiconductor wafer 100 has a first side 100A or the die 101-bearing side, and a second side 100B opposite to the first side 100A. A molding material 103 is disposed over the first side 100A and encapsulating the dies 101. In some embodiments, the molding material 103 is composed of a first type of plastic material to be discussed below. A sealing structure 120 is also disposed over the first side 100A of the semiconductor wafer 100 but only at the periphery 100C of the wafer 100. In some embodiments, the sealing structure 120 is composed of a second type of plastic materials to be discussed below. It should be recognized that practical applications of the embodiment CoWoS device may also include other features, structures, layers, connections, and so on that have not been included in FIG. 1 for ease of illustration. For example, the semiconductor wafer 100 described herein can be replaced by an interposer having at least one through silicon via (TSV) coupling the die 101 in proximal to the first side 100A and a substrate (not shown) in proximal to a second side 100B.

In some embodiments, the periphery 100C of the semiconductor wafer 100 possesses a width below 5 millimeter. Adopting a width greater than 5 millimeter in the periphery 100C could unduly limit the usable area of the semiconductor wafer 100. In some embodiments, the periphery 100C of the semiconductor wafer 100 possesses a width of about 3 millimeter. The width of the periphery upon which the sealing structure 120 resides depends on the molding tool capability. If the design of the molding tool permits a retraction of the molding material 103 for less than 3 millimeter, smaller width of the periphery 100C can be adopted in the present embodiment. Alternatively stated, on a wafer 100 having a diameter of 300 millimeter, a width of the molding material 103 can be greater than or equal to about 290 millimeter.

As shown in FIG. 1, in some embodiments, the die 101 includes a thickness of from about 550-750 micrometers (μm). Normally, the molding material 103 possesses a thickness greater than the thickness of the die 101. For example, a thickness of the molding material 103 can be in a range from about 500-900 μm. In some embodiments, the molding material 103 includes thermal conducting filler such as graphite and boron nitride. For example, the filler includes 10 to about 30 wt % graphite and 5-60 wt % boron nitride, wherein all weights are based on the weight of the molding material 103. In some embodiments, the graphite has a particle size of about 1 to about 100 micrometer, and can be clearly identified under electron microscope.

As discussed previously, molding material 103 includes a first type of plastic materials and the sealing structure 120 includes a second type of plastic materials. In some embodiments, the first type of plastic materials and the second type of plastic materials are different. In some embodiments, the first type of plastic materials may be selected from a wide variety of thermoplastic resins, blend of thermoplastic resins, thermosetting resins, or blends of thermoplastic resins with thermosetting resins. The first type of plastic materials may also be a blend of polymers, copolymers, terpolymers, or combinations comprising at least one of the foregoing organic polymers. The organic polymer can also be an oligomer, a homopolymer, a copolymer, a block copolymer, an alternating block copolymer, a random polymer, a random copolymer, a random block copolymer, a graft copolymer, a star block copolymer, a dendrimer, or the like, or a combination comprising at last one of the foregoing organic polymers. Examples of the organic polymer are polyacetals, polyolefins, polyacrylics, polycarbonates, polystyrenes, polyesters, polyamides, polyamideimides, polyarylates, polyarylsulfones, polyethersulfone, polyphenylene sulfides, polyvinyl chlorides, polysulfones, polyimides, polyetherimides, polytetrafluoroethylene, polyetherketones, polyether ether ketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitrites, polyvinyl esters, polysulfonates, polysulfides, polythioesters, polysulfones, polysulfonamides, polyureas, polyphosphazenes, polysilazanes, styrene acrylonitrile, acrylonitrile-butadiene-styrene (ABS), polyethylene terephthalate, polybutylene terephthalate, polyurethane, ethylene propylene diene rubber (EPR), polytetrafluoroethylene, fluorinated ethylene propylene, perfluoroalkoxyethylene, polychlorotrifluoroethylene, polyvinylidene fluoride, or the like, or a combination comprising at least one of the foregoing organic polymers. In some embodiments, the second type of plastic materials can be composed of any of the above listed materials but different from the first type of plastic materials. As previously discussed, in some embodiments, the first type of plastic materials includes thermal conducting fillers whereas the second type of plastic materials does not include thermal conducting fillers.

Examples of blends of thermoplastic resins include acrylonitrile-butadiene-styrene/nylon, polycarbonate/acrylonitrile-butadiene-styrene, acrylonitrile butadiene styrene/polyvinyl chloride, polyphenylene ether/polystyrene, polyphenylene ether/nylon, polysulfone/acrylonitrile-butadiene-styrene, polycarbonate/thermoplastic urethane, polycarbonate/polyethylene terephthalate, polycarbonate/polybutylene terephthalate, thermoplastic elastomer alloys, nylon/elastomers, polyester elastomers, polyethylene terephthalate/polybutylene terephthalate, acetal/elastomer, styrene-malelcanhydride/acrylonitrile-butadiene-styrene, polyether etherketone/polyethersulfone, polyether etherketone/polyetherimide polyethylene/nylon, polyethylene/polyacetal, or the like.

Examples of thermosetting resins include polyurethane, natural rubber, synthetic rubber, epoxy, phenolic, polyesters, polyamides, silicones, or the like, or a combination comprising at least one of the foregoing thermosetting resins. Blends of thermoset resins as well as blends of thermoplastic resins with thermosets can be utilized.

Figure 2:
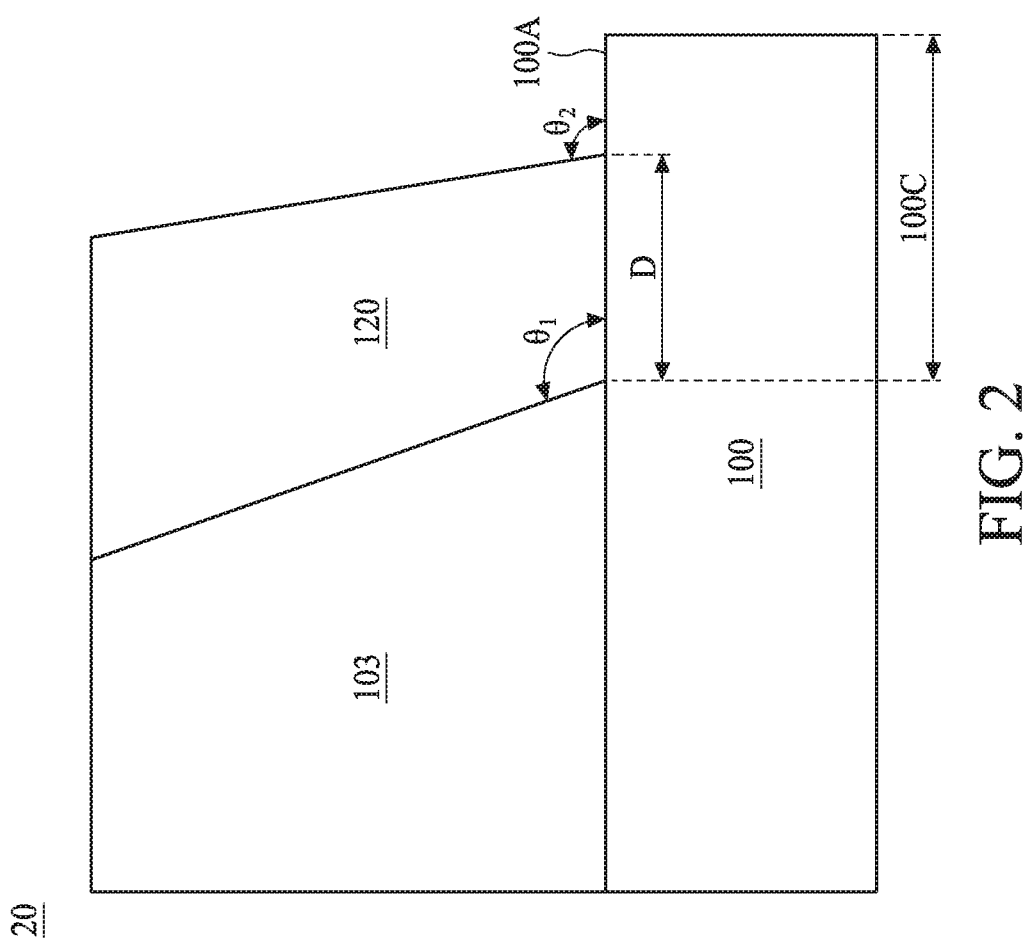
FIG. 2 is a partial enlarged cross sectional view of the semiconductor packaged wafer of FIG. 1, in accordance with some embodiments of the present disclosure.

Referring to FIG. 2, FIG. 2 is a partial enlarged cross sectional view 20 of the semiconductor packaged wafer 10 of FIG. 1, in accordance with some embodiments of the present disclosure. As shown in FIG. 1, the sealing structure 120 fully occupies the periphery 100C of the first side 100A of the semiconductor wafer 100. However, in the enlarged cross sectional view 20, the sealing structure 120 may partially occupy the periphery 100C of the semiconductor wafer 100 with a width D. In some embodiments, the width D can be smaller than 3.5 millimeter.

In some embodiments, the sealing structure 120 is termed "bevel seal" because the outer sidewall of the sealing structure 120 can be oblique, thereby forming an angle, θ2, with respect to the first side 100A of the wafer 100. Note the angle θ2 is defined to sweep, outside of the sealing structure 120, from the outer sidewall of the sealing structure 120 toward the first side 100A of the wafer 100. In some embodiments, the angle θ2 can be an obtuse angle from about 90 to about 135 degrees. However, the angle θ2 can be an acute angle from about 45 to about 90 degrees, as subsequently shown in FIG. 17.

Still referring to FIG. 2, the bevel seal 120 shows an oblique inner sidewall in contact with the molding material 103. For example, an angle θ1 can be defined between the inner sidewall of the sealing structure 120 with respect to the first side 100A of the wafer 100. Note the angle θ1 is defined to sweep, inside of the sealing structure 120, from the inner sidewall of the sealing structure 120 toward the first side 100A of the wafer 100. In some embodiments, the angle θ1 can be an obtuse angle from about 90 to about 135 degrees.

Figure 3:
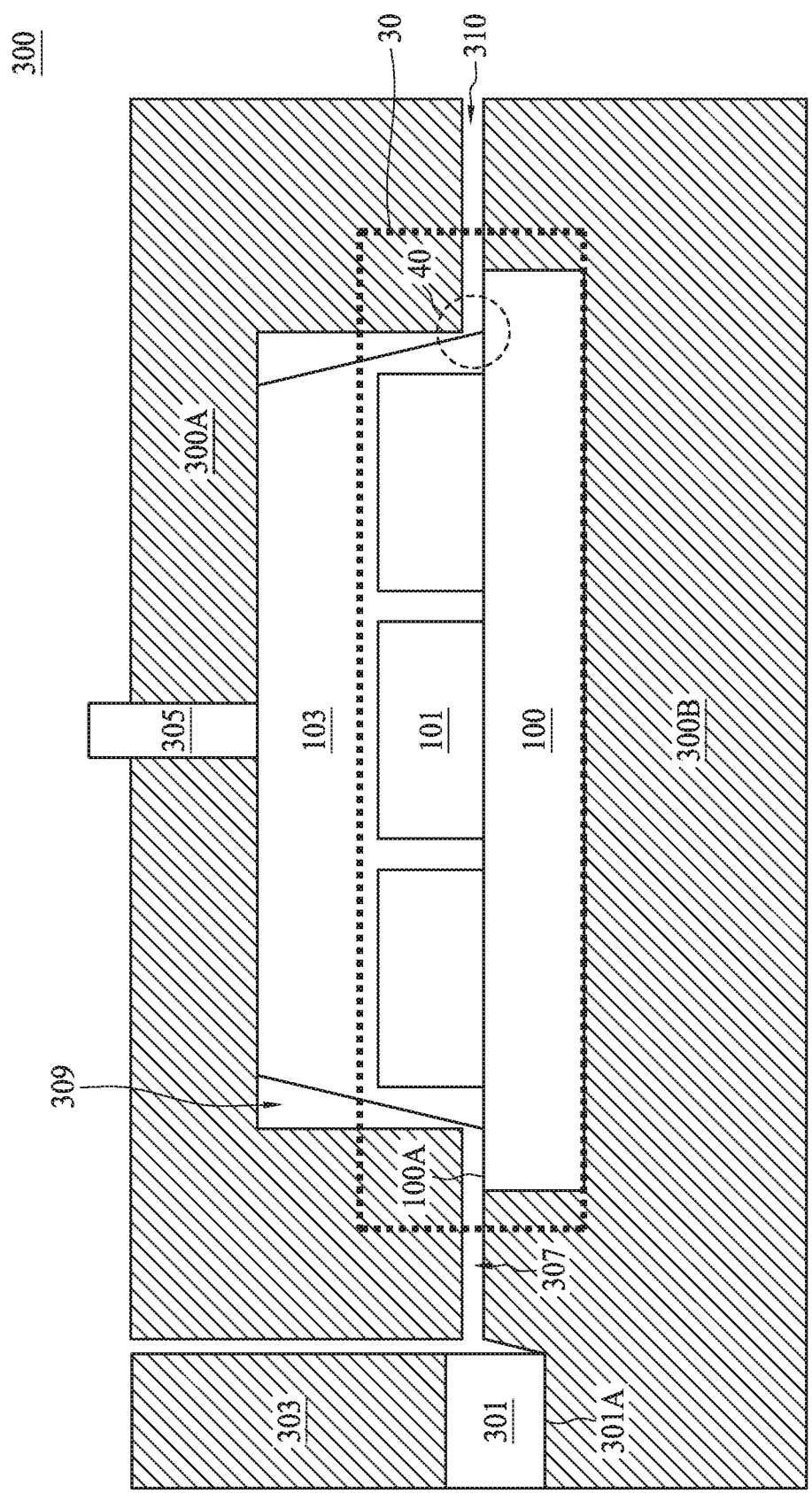
FIG. 3 to FIG. 7 are cross sectional views of a semiconductor packaged wafer in various operations of manufacturing thereof, in accordance with some embodiments of the present disclosure.
Figure 4:
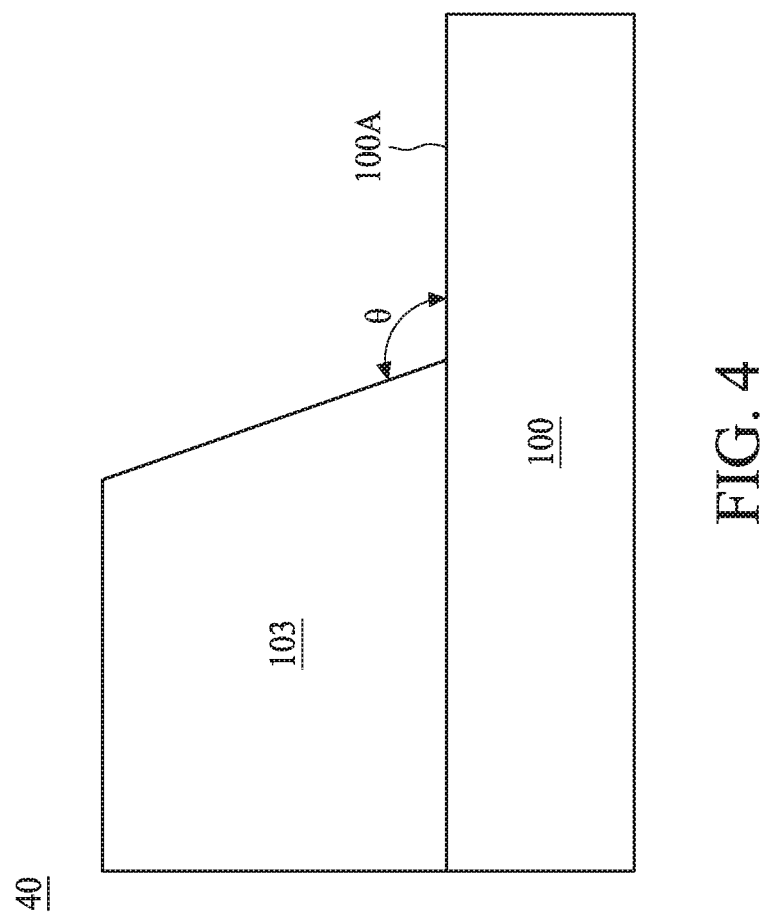
Figure 20:
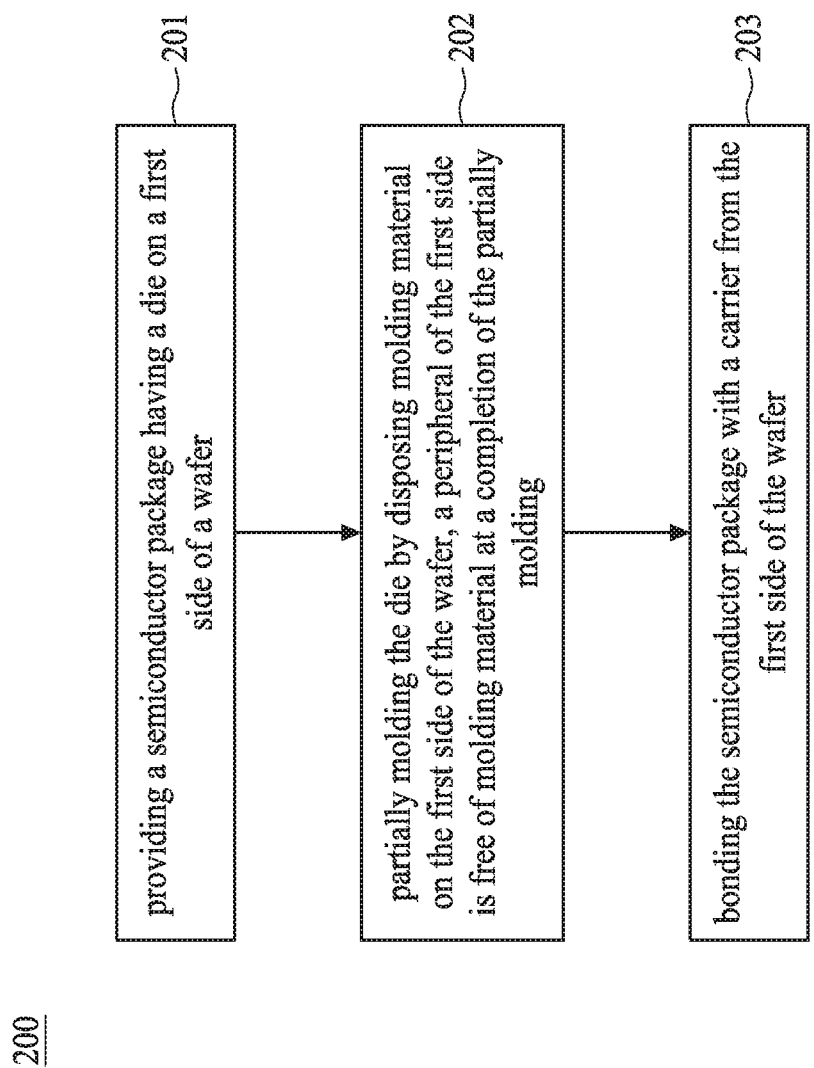
FIG. 20 is a flow diagram showing manufacturing of a semiconductor packaged wafer in various stages of operations, in accordance with some embodiments of the present disclosure.

FIG. 3 to FIG. 7 are cross sectional views of a semiconductor packaged wafer in various operations of manufacturing thereof, in accordance with some embodiments of the present disclosure. FIG. 20 lists out the operations 201, 202, 203 required for the manufacturing method 200 in addressing FIG. 3 to FIG. 7. Similarly, FIG. 21 lists out the operations 211, 212, 213 required for the manufacturing method 200 in addressing FIG. 3 to FIG. 7. As shown in FIG. 3, operation 201 of FIG. 20, and operation 211 of FIG. 21, a semiconductor package 30 having a plurality of dies 101 on a first surface 100A of a wafer 100 is positioned in a first molding tool 300. Alternatively, the semiconductor package 30 may include other kind of carrier such as an interposer or a printed circuit board. In some embodiments, the first molding tool 300 has an upper chase 300A and a lower chase 300B. The semiconductor package 30 is first positioned on the lower chase 300B and subsequently covered by the upper case 300A prior to molding material disposal. In some embodiments, the first molding tool 300 is made of a very dense, high-hardness steel, e.g., a chrome steel, and all of the surfaces of the chase that come into contact with the molding materials during the molding process, including piston 303, gate 307, cavity 309, vent 310, and ejector pins 305, are plated with a coating of chromium. This surface treatment renders these surfaces substantially non-reactive with the highly reactive epoxy molding materials, and the problems of mold sticking and cracked or cratered semiconductor package 30 is substantially reduced, or eliminated altogether.

Referring to FIG. 3, which shows a cross-sectional view of the first molding tool 300, the lower chase 300B may have a flat surface, and the upper chase 300A may be of a U-shape, such that when brought together a cavity 309 is formed between the lower chase 300B and the upper chase 300A sized appropriately to accommodate the semiconductor package 30. The lower chase 300B and the upper chase 300A may have different thickness from the ones shown. The lower chase 300B and the upper chase 300A shown in FIG. 3 are only for illustrative purpose and not limiting.

The formulation of molding material 301 for semiconductor packages 30 is a series of compromises calculated to produce desired properties, e.g., good adhesion between the compound and the components of the package 30, while minimizing undesirable effects, such as mold sticking and interfacial defects caused by unbalanced and/or incomplete polymer cross-linking. Suitable compositions for the molding material 301 are previously discussed and can be referred thereto.

During the molding process, an epoxy molding material 301 in a solid, pelletized form is dispensed into a heated pot 301A, where it is quickly melted to a molten state. A close-fitting piston 303 is then brought down forcefully into the pot 301A and the molten molding material 301 is thereby forced out of the pot 301A, through the gate 307 and into the cavity 309 of the first molding tool 300 to form the molding body 103 over the plurality of dies 101. Air vents 310 extending through the walls of the lower chase 300B and the upper chase 300A permit the air in the cavity 309 to be expelled by the inrushing molding material 301. When the molding material 301 is cured solid on the first side 100A of the wafer 100, the lower chase 300B and the upper chase 300A of the first molding tool 300 are separated from each other, and one or more ejector pins 305 in the first molding tool 300 are actuated from, for example, a top of the molding body 103 to eject the newly molded semiconductor package 30.

However, FIG. 3 is not a limiting illustration to the molding process. Other molding operations can be adopted in the packaging method described herein. For example, molding material can be placed on top of the semiconductor wafer 100 and semiconductor dies 101. Thereafter, the lower chase 300B and the upper chase 300A are brought together, spreading the molding material to cover the plurality of dies 101 and fill into the space between the plurality of dies 101, thereby forming a molding body 103 as shown in FIG. 3. The molding material may be a solid encapsulate, such as Epoxy Molding Compound (EMC), polyimide, epoxy, silicon, and/or the like. The lower chase 300B and the upper chase 300A may be heated in order to cure the molding material.

Figure 21:
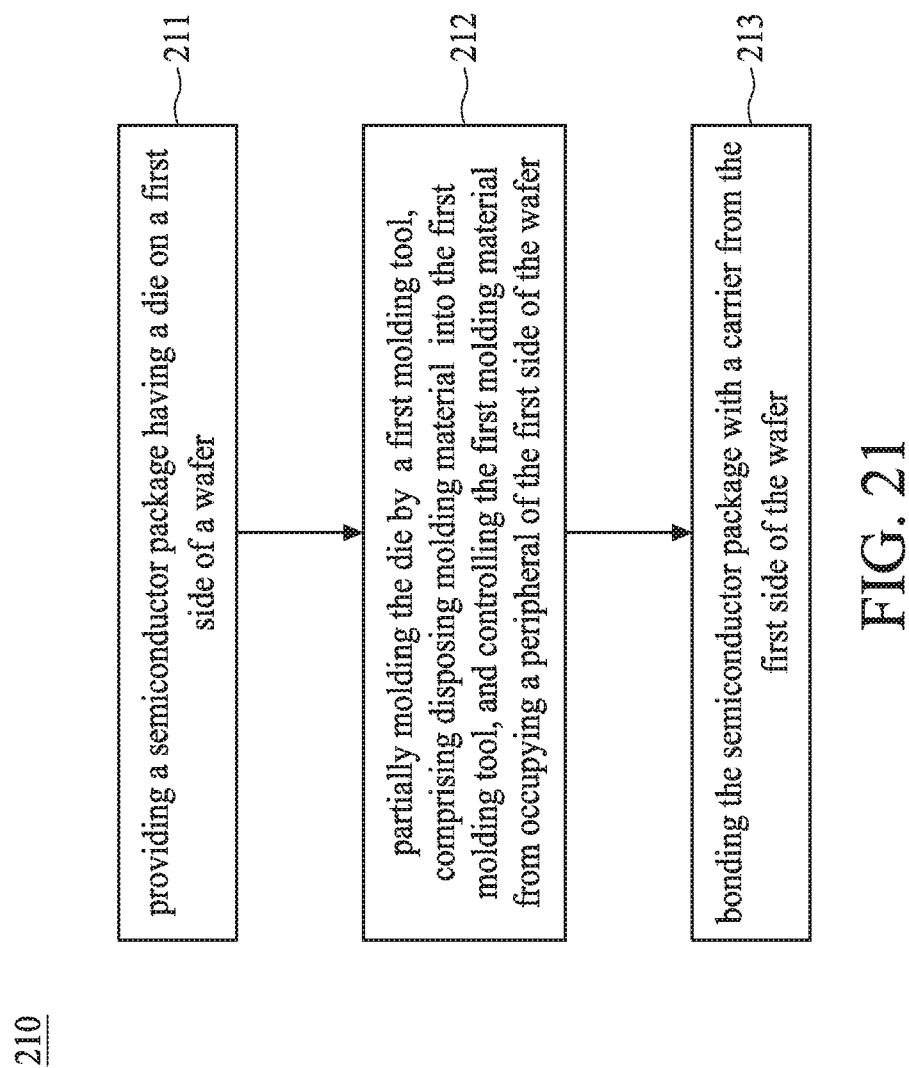
FIG. 21 is a flow diagram showing manufacturing of a semiconductor packaged wafer in various stages of operations, in accordance with some embodiments of the present disclosure.

Referring to FIG. 3, operation 202 of FIG. 20, and operation 212 of FIG. 21, in some embodiments, the lower chase 300B and the upper chase 300A together with the cavity formed in between are typically heated so that the molding material will be thermally compressed onto the first surface 100A of the wafer 100. The heating and pressure within the first molding tool 300 may be sufficient to cure the molding material. Once bonded to the first surface 100A of the wafer 100, the molding material becomes the molding body 103 as shown in FIG. 3. In an embodiment, the bonding process is controlled by mechanical and/or optical process, or controlled by a control unit to control the magnitude and time of force applied. The molding body 103 covers the surfaces of the dies 101, the first surface 100A, but free from the side molding edges of the wafer 100. In some embodiments, the molding body 103 is retracted from the edge of the wafer 100 by a predetermined distance, for example, less than 5 millimeter, at a periphery 100C of the wafer 100. The periphery 100C free of molding materials can be achieved by several means. For example, the upper chase 300A having a U-shape may protrude the two legs right upon the periphery 100C of the wafer 100, assuring the periphery 100C incapable of accommodating any molding materials. For another example, the quantity of the molding material at its solid or pelleted form is calculated such that after spreading out all the molding material originally placed over a center of the semiconductor package 30, the periphery 100C of the wafer is not covered by the molding material due to the quantity shortage. In either molding means discussed above, the periphery 100C and the side edge of the semiconductor wafer 100 are free of any molding material at a completion of the molding operation.

Because thermal compression may be utilized to melt, the solid molding material prior to the spreading of the molding material, the molding material may end up having an oblique sidewall after the curing operation. As circled by dotted lines in FIG. 3 and magnified in FIG. 4, the enlarged view 40 showing the spread and cured molding body 103 is having an angle θ with respect to the first surface 100A of the wafer 100. Note the angle θ is defined to sweep, outside of the molding body 103, from the sidewall of the molding body 103 toward the first side 100A of the wafer 100. In some embodiments, the angle θ can be an obtuse angle from about 90 to about 135 degrees.

Figure 5:
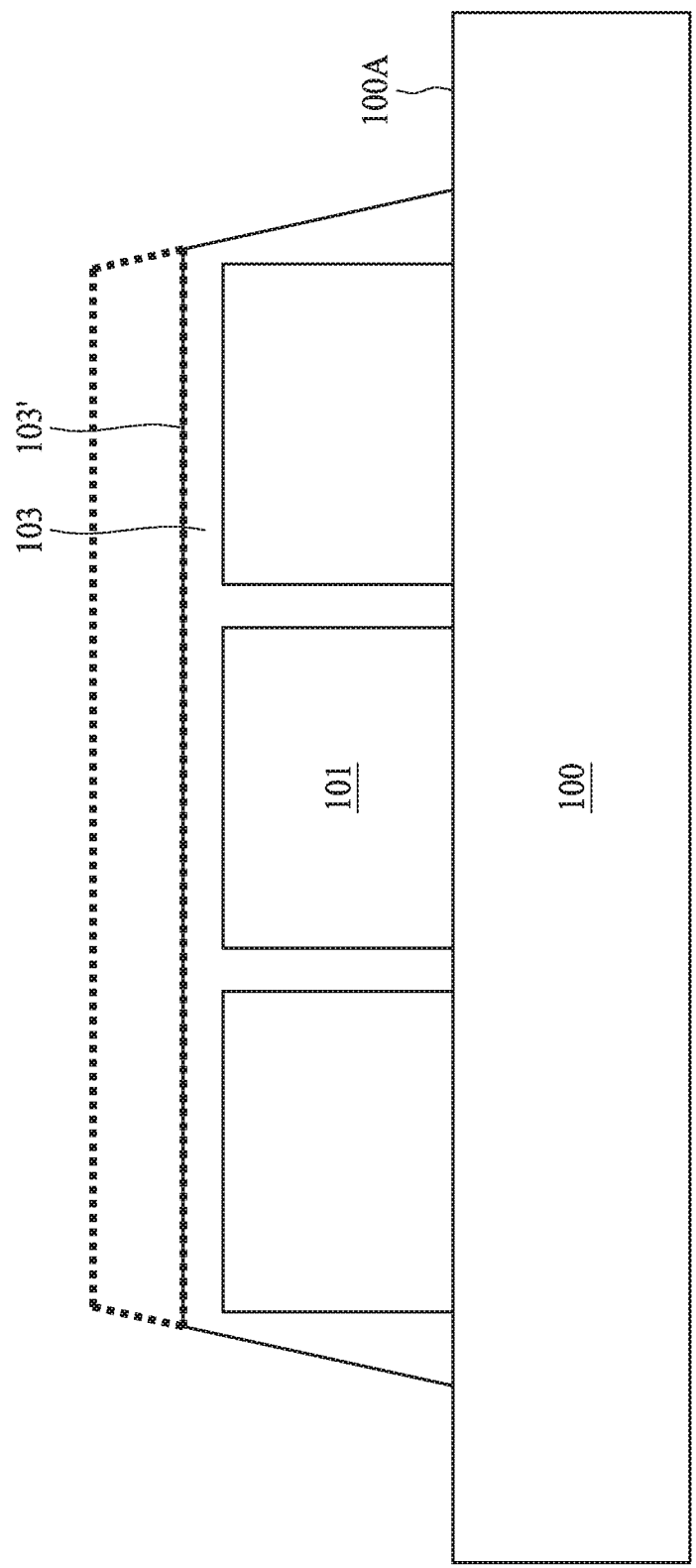

Next, as illustrated in FIG. 5, once the molding body 103 is sufficiently bonded to the first surface of the wafer 100, the lower chase 300B and the upper chase 300A may be separated and the encapsulated semiconductor package 30 removed with the aid of the ejector pins 305. As shown in FIG. 5, the molding body 103 is thinned down by a polishing operation to expose a grinded surface 103' in preparation to the subsequent bonding operation. Referring back to FIG. 3, since the molding material is controlled not to cover the side edge, the periphery 100C, and the second side 100B of the wafer 100, conventional trimming operation conducted over the second side 100B can be eliminated.

Nevertheless, the addition of a "release agent" to the molding compound chemistry is required to further reduce the chemical bonding between the molding material and the surfaces of the molding apparatus that come into contact with the molding compound during molding, particularly the surfaces of the cavity 309. The cavity 309 is, of course, necessary to form and shape the molding body 103, and also to enable complete densification of the body by the application of hydrostatic pressure to the molding material by piston 303 during the molding process. The addition of this agent to the molding compound is therefore especially critical in epoxy chemistry due to the large number of reactive sites present in the mold chase during the molding process. The release agent is activated thermally, and upon melting, coats the surface of all of the components in the molding matrix. This non-reactive coating inhibits interfacial bonding of the molding material and all other components within the package materials matrix, such as the wafer 100 and the dies 101. Reducing the total amount of mold release agent(s) in the molding compound would thus substantially improve the interfacial bonding within the package component matrix. However, for the reasons given above, when reducing the amount of release agent in the molding material, particular care must be taken in the choice of mold tool steel and/or mold tool surface treatments to prevent chemical bonding to the first molding tool 300, which would inhibit proper package ejection from the mold and result, in defective packages.

To improve the chemical bonding of the molding material to the package components, an "adhesion promoter," or "coupling agent," is added to the molding material during its formulation. Due to the reduction in interfacial bonding caused by the addition of the mold release agents, it is necessary to add a higher percentage of the adhesion promoters than might otherwise thought to be desirable. This is because, in relatively larger amounts, these coupling agents can increase melt viscosity, which reduces the surface wetting of the molding material to the surface of wafer 100 and other components in the semiconductor package 30. This increased melt viscosity is due to the premature cross-linking of the base resin and the hardener caused by the overabundance of the coupling agent during the mixing that occurs in the transfer, or injection, of the molding material into the cavity 309.

Figure 6:
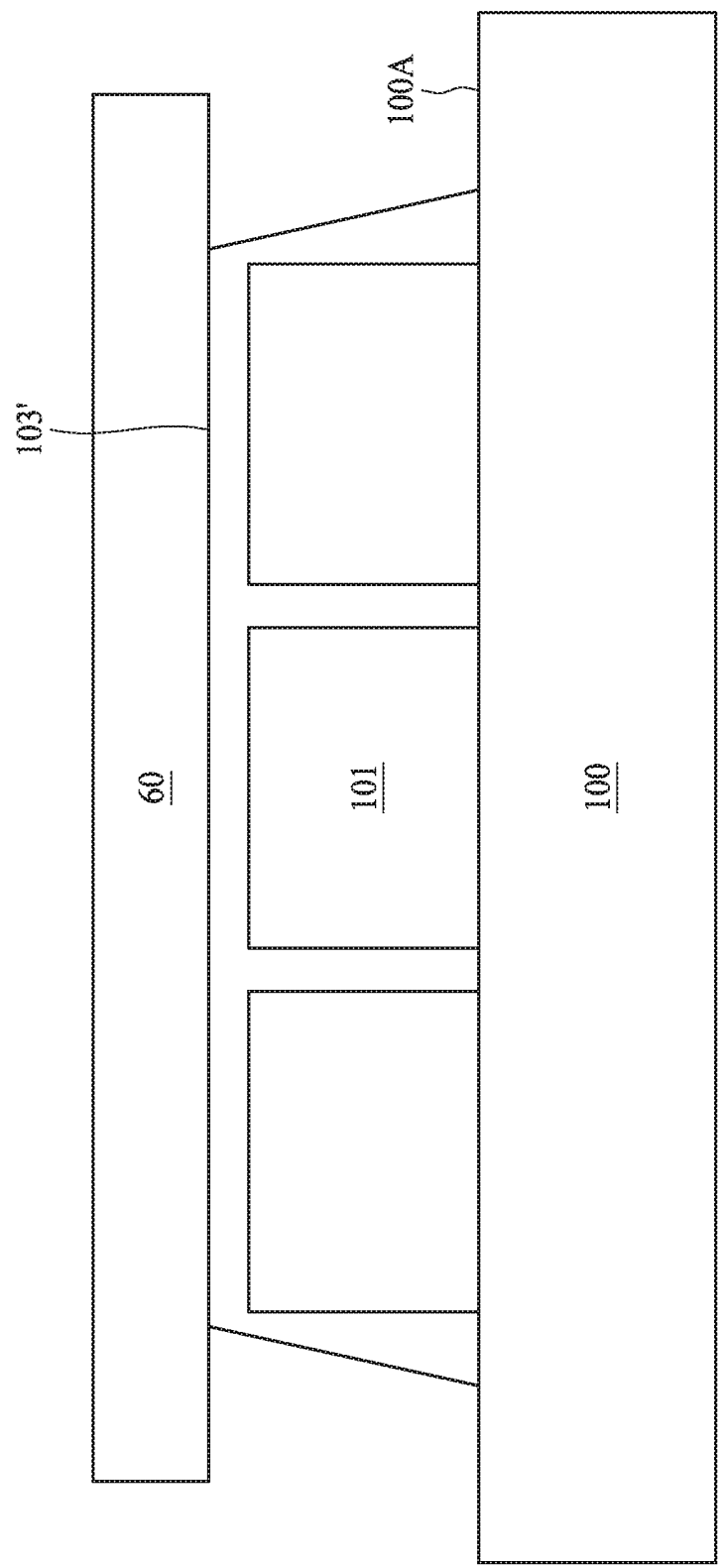
Figure 7:
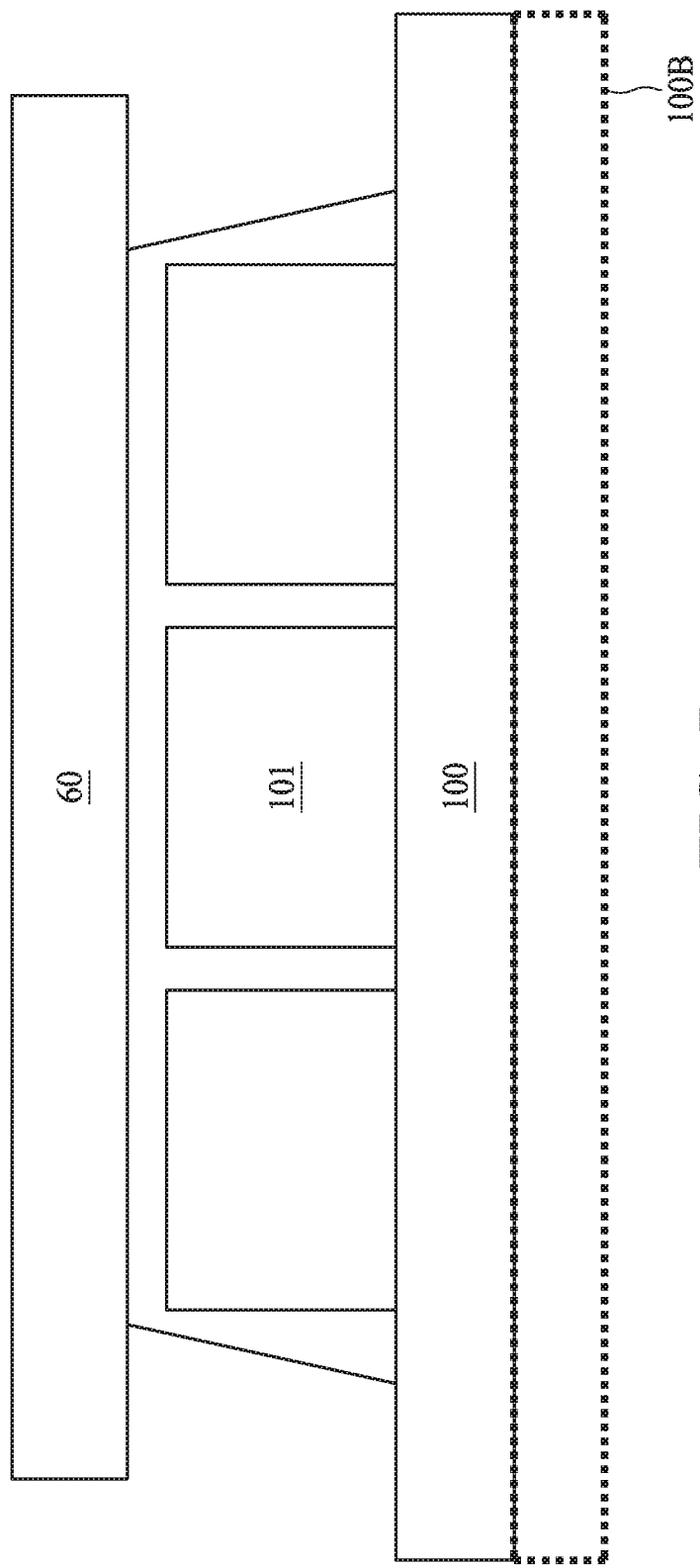
Figure 8:
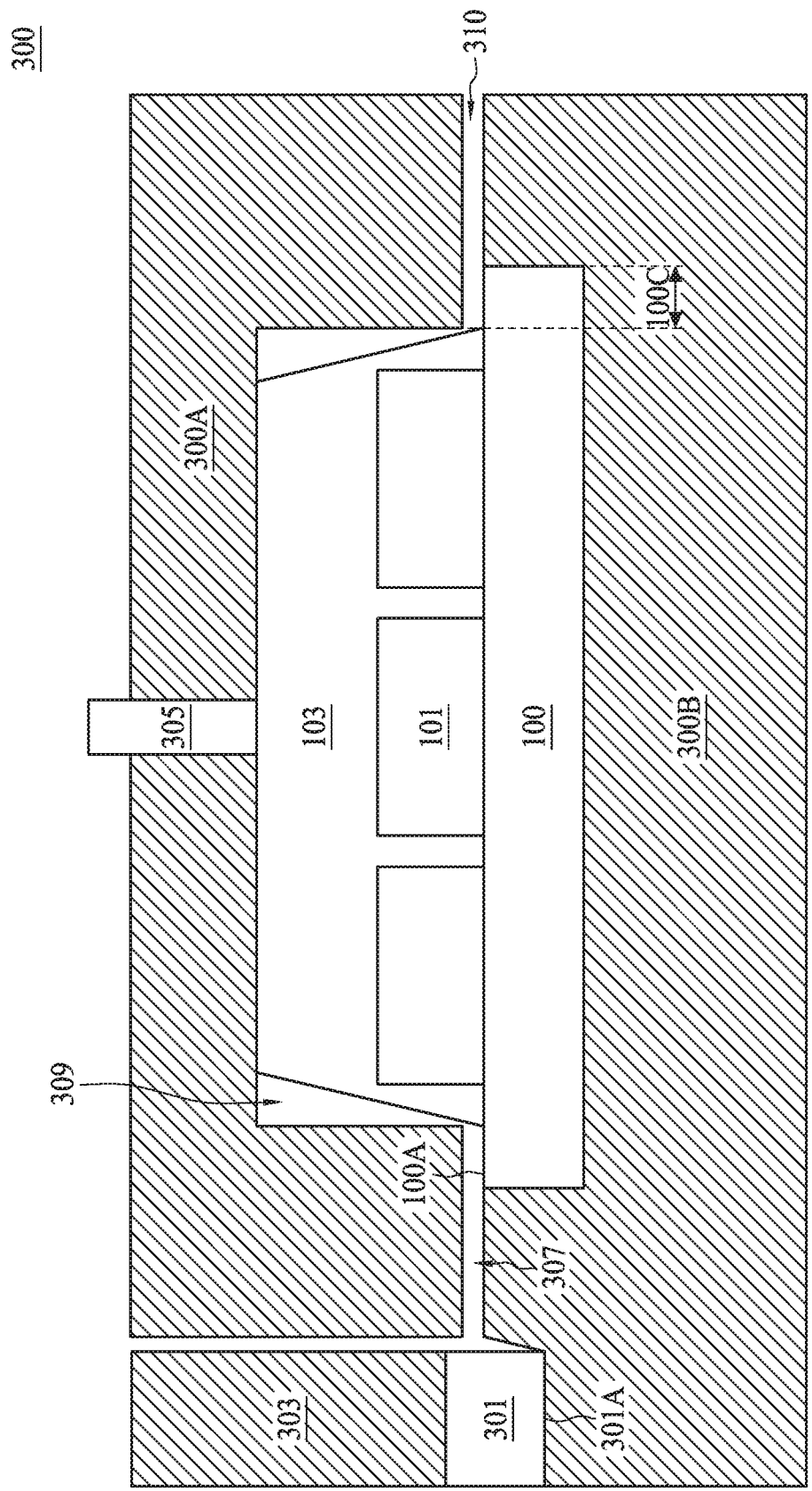
FIG. 8 to FIG. 13 are cross sectional views of a semiconductor packaged wafer in various operations of manufacturing thereof, in accordance with some embodiments of the present disclosure.

Referring to FIG. 6, operation 203 of FIG. 20, and operation 213 of FIG. 21, the semiconductor package 30 is now bonded to a carrier 60 at the grinded surface 103' on the first side 100A of the wafer 100. FIG. 7 shows an additional operation of thinning down the wafer 100 uniformly from the second side 100B of the wafer 100. Alternatively stated, a thickness across the wafer 100 is maintained uniform before and after the uniform thin down operation conducted at the second side 100B of the wafer 100.

Figure 9:
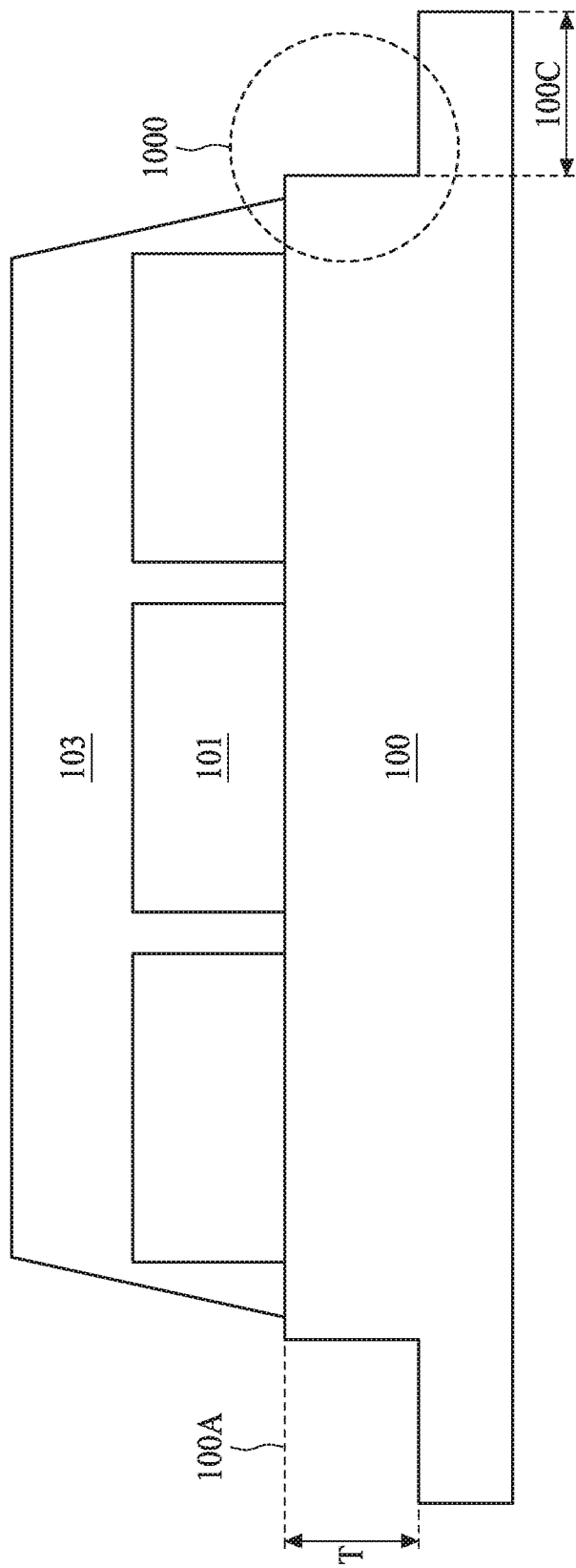

FIG. 8 to FIG. 13 are cross sectional views of a semiconductor packaged wafer in various operations of manufacturing thereof, in accordance with some embodiments of the present disclosure. FIG. 20 lists out the operations 201, 202, 203 required for the manufacturing method 200 in addressing FIG. 8 to FIG. 13. Similarly, FIG. 21 lists out the operations 211, 212, 213 required for the manufacturing method 200 in addressing FIG. 8 to FIG. 13. Description of FIG. 8 can be referred to previous discussion over FIG. 3 and is not repeated here for brevity. Referring to FIG. 9, after ejecting from the first molding tool 300, the semiconductor package 30 is then partially trimmed from the first surface 100A of the wafer 100 at the periphery 100C. In some embodiments, the trimming is conducted by rotating the wafer 100 against a fixed saw overlying only at the periphery 100C of the wafer, and by adjusting the vertical position of the wafer 100, the trimmed thickness T can be controlled. The trimmed thickens T is determined considering subsequent thinning of the semiconductor wafer 100 from a second side 100B opposite to the first side 100A. In some embodiments, the trimmed thickness T is in a range of from about 250 to about 500 micrometer. For a silicon wafer having a diameter of 300 millimeter, the corresponding thickens is around 775 µm. If the trimmed thickness T is lower than 250 µm, the remaining thickness could overload the apparatus used in subsequent silicon grinding operation. On the other hand, if the trimmed thickness T is greater than 500 µm, the remaining thickness may lead to edge chipping during subsequent wafer handling. This additional partial trimming operation only at the periphery 100C can be adopted in the case where the molding body 103 was not well controlled to be free from the periphery 100C. In other words, if under thermal compression, the molding materials undesirably flow to the periphery 100C of the wafer, the partial trimming at the periphery 100C from the first side 100A of the wafer 100 can be conducted.

Figure 10:
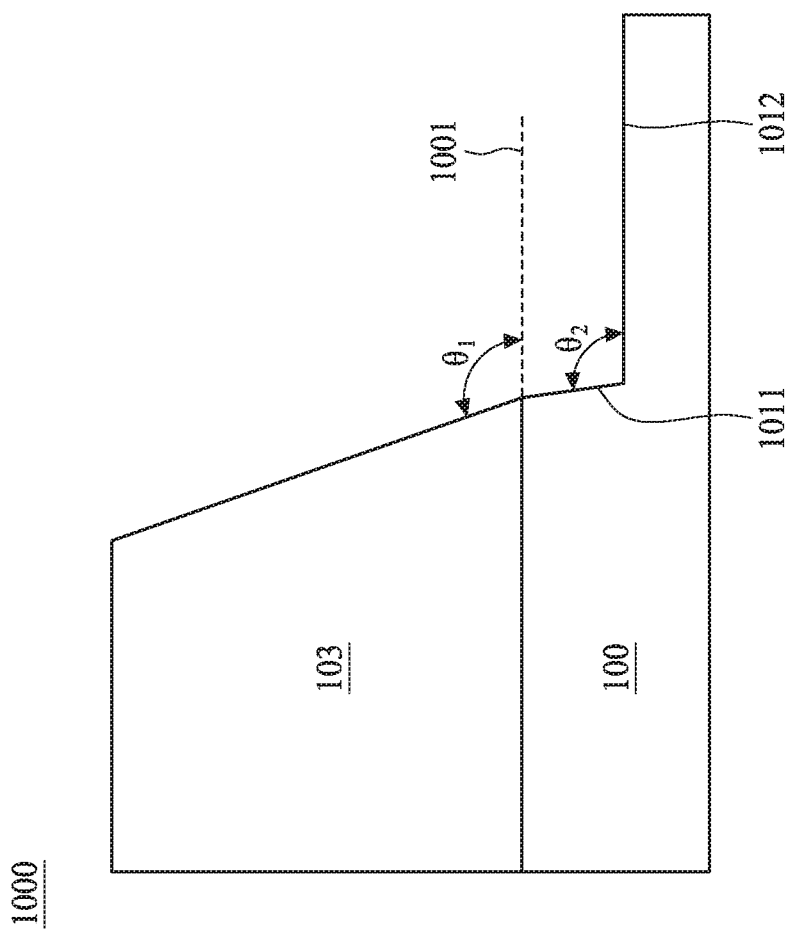

As circled by dotted lines in FIG. 9 and magnified in FIG. 10, the enlarged view 100C showing the spread and cured molding body 103 is having an angle θ1 with respect to the first surface 100A of the wafer 100 and an angle θ2 defined by the sidewall 1011 and the bottom 1012 of the trimmed recess 1001. Note the angle θ1 is defined to sweep, outside of the molding body 103, from the sidewall of the molding body 103 toward the first side 100A of the wafer 100, which has been removed in this case. The first side 100A of the wafer 100 can be extrapolated from the interface between the molding body 103 and the wafer 100, as shown by the dotted lines. In some embodiments, the angle θ1 can be an obtuse angle from about 90 to about 135 degrees. If the angle θ1 is smaller than 90 degrees, the sidewall of the molding body 103 inclines toward the periphery 100C and hence hindering the subsequent trimming of the semiconductor wafer 100 from the first side 100A. If the angle θ1 is greater than 135 degrees, the material of the molding body 103 may not fully cover all the dies 101. Note the angle θ2 is defined to sweep outside of the wafer 100, from the sidewall 1011 toward the bottom 1012 of the trimmed recess 1001. In some embodiments, the angle θ2 can be an obtuse angle from about 90 to about 135 degrees. If the angle θ2 is smaller than 90 degrees, the sidewall of the semiconductor wafer 100 inclines toward the periphery 100C and hence forming a stress-concentrating structure at the corner of the angle θ2. If the angle θ2 is greater than 135 degrees, after the trimming of the semiconductor wafer 100 from the second side 1009, a sharp turn at the corner of the angle θ2 also forms a stress-concentrating structure. The stress-concentrating structure for a semiconductor wafer shall be avoided in order to prevent undesirable chipping at various operation stages. Normally, since the angle θ2 is defined by the angle of the fixed saw thinning down the periphery 100C, angle θ2 is better controlled than angle θ1 caused by the flowing of the molding material. In some embodiments, angle θ2 is more likely to approach 90 degrees. In other words, angle θ2 is normally smaller than angle θ2.

Figure 11:
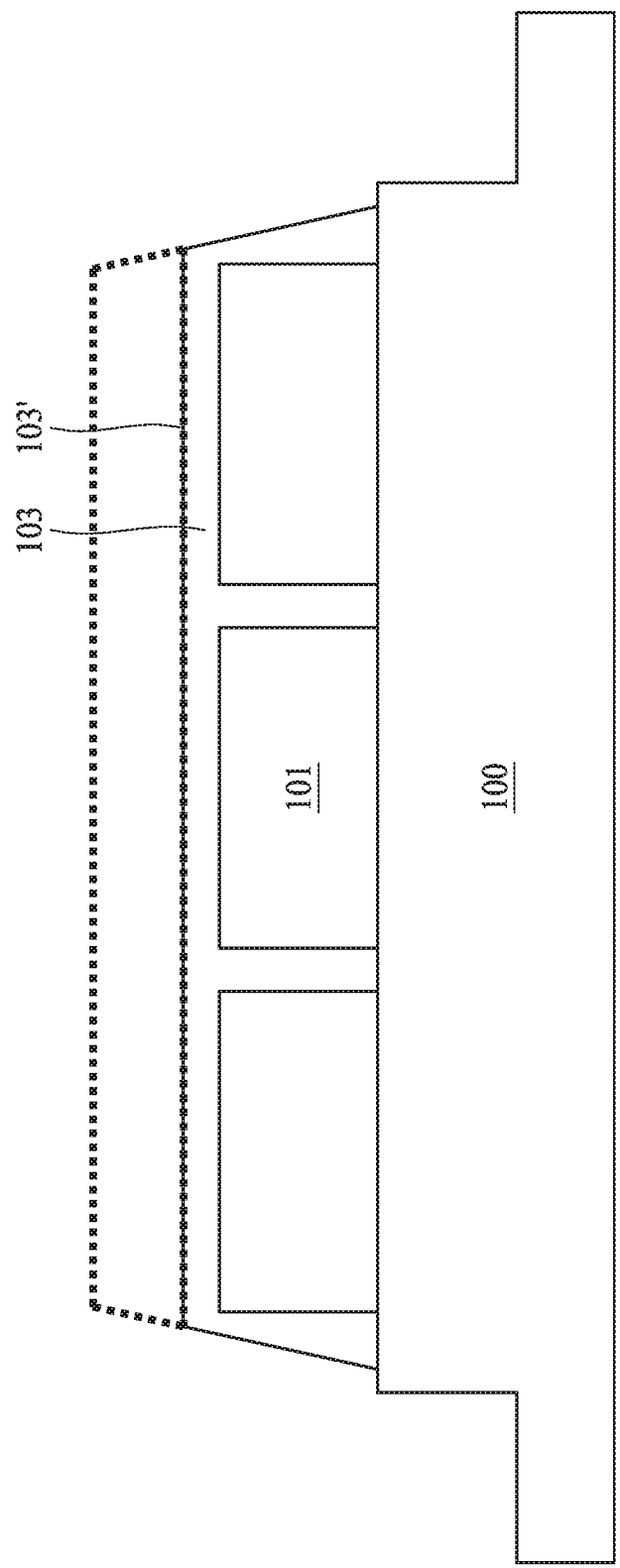

Next, as illustrated in FIG. 11, once the molding body 103 is sufficiently bonded to the first surface of the wafer 100, the lower chase 300B and the upper chase 300A may be separated and the encapsulated semiconductor package 30 removed with the aid of the ejector pins 305. As shown in FIG. 11, the molding body 103 is thinned down by a polishing operation to expose a grinded surface 103' in preparation to the subsequent bonding operation. Referring back to FIG. 8, since the molding material is controlled not to cover the side edge, the periphery 100C, and the second side 100B of the wafer 100, conventional trimming operation conducted over the second side 100B can be eliminated.

Figure 12:
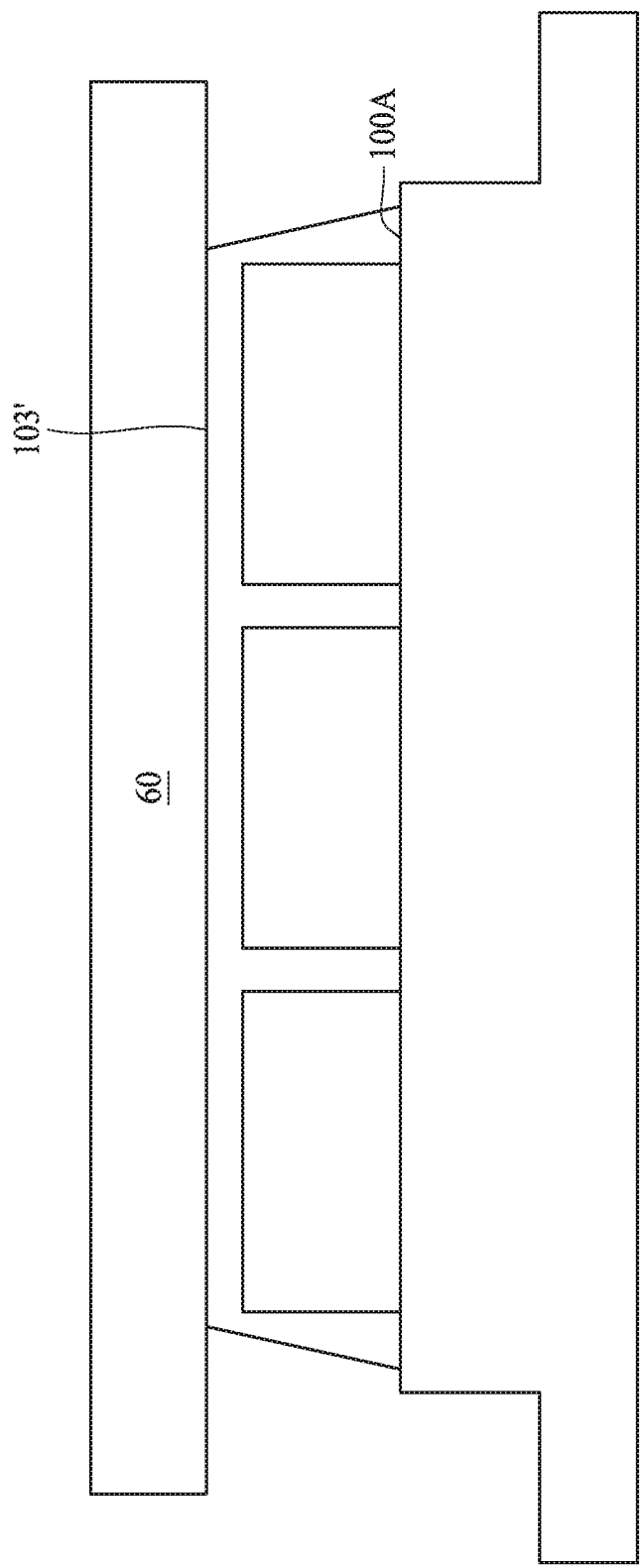
Figure 13:
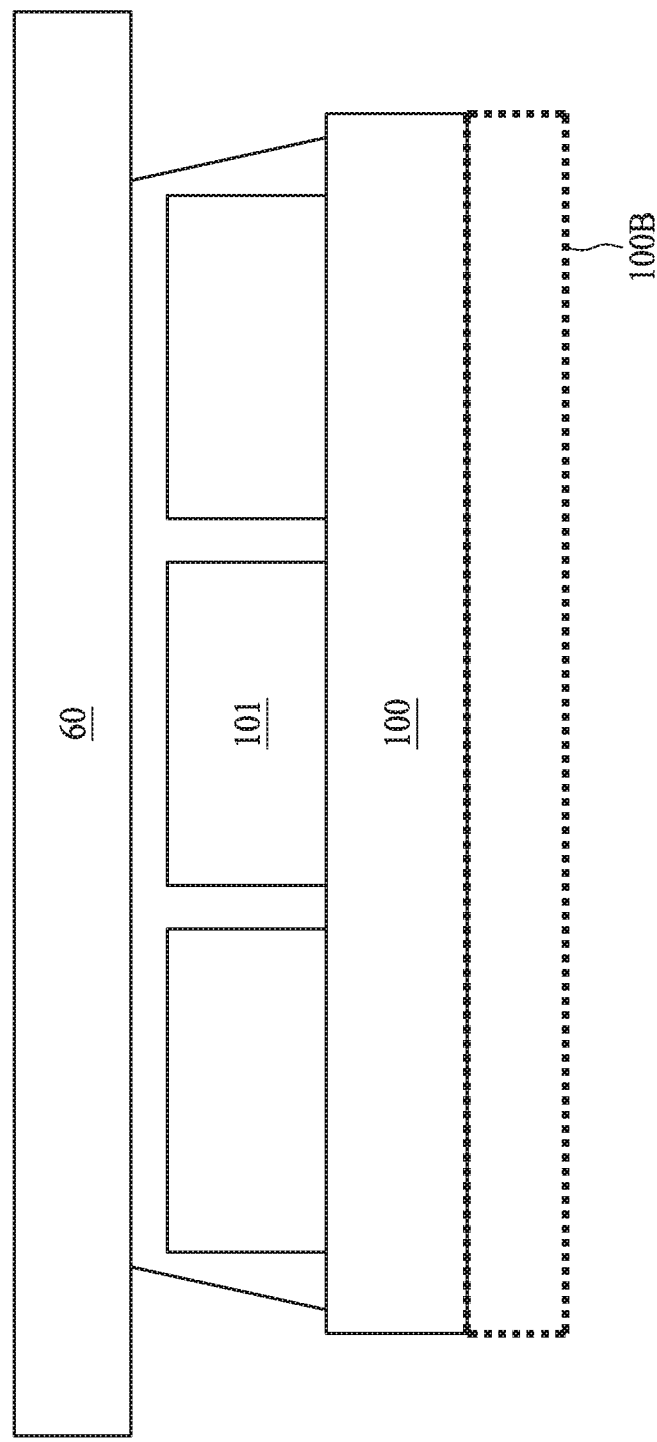
Figure 14:
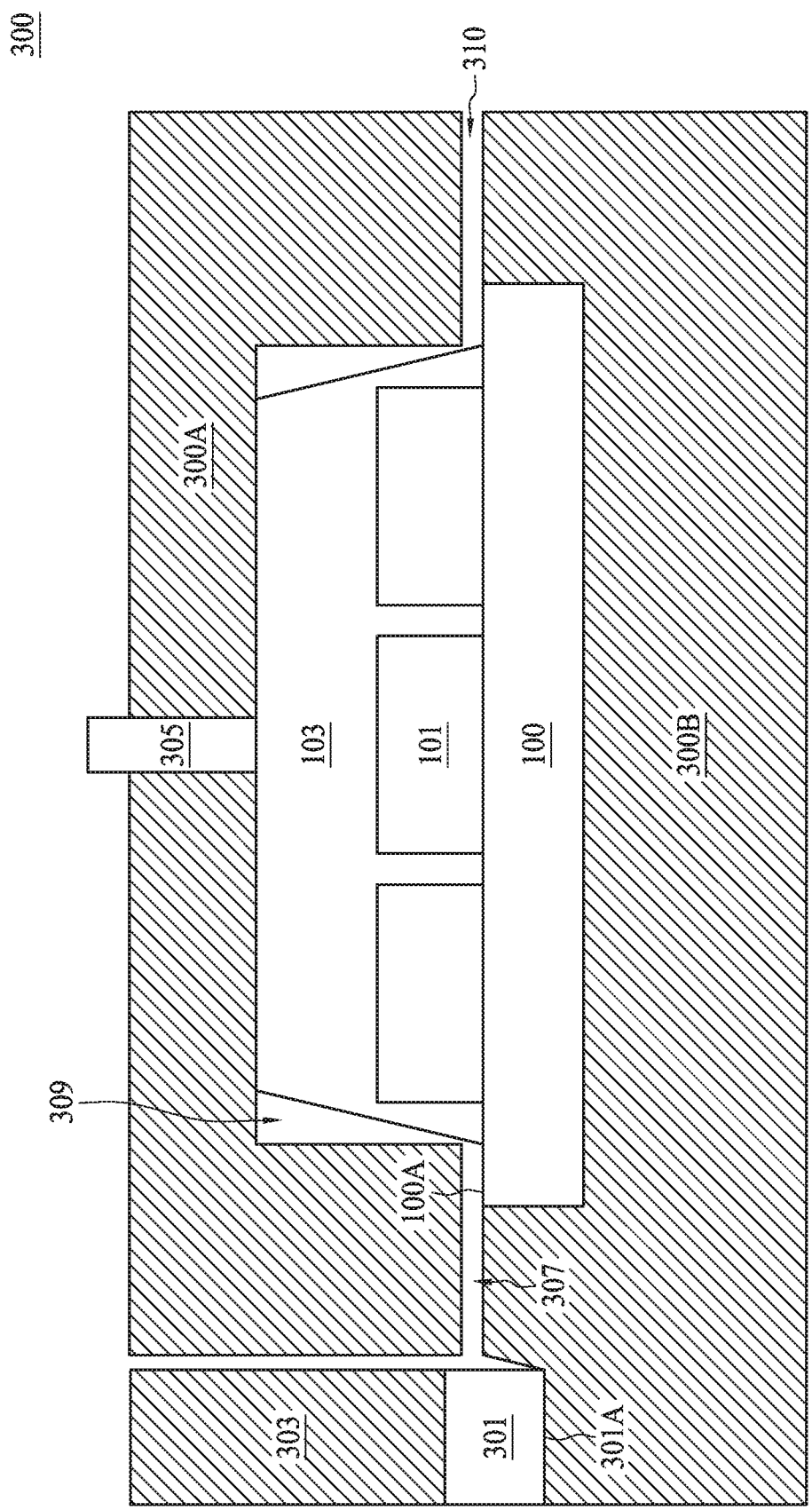
FIG. 14 to FIG. 19 are cross sectional views of a semiconductor packaged wafer in various operations of manufacturing thereof, in accordance with some embodiments of the present disclosure.

As shown in FIG. 12, the semiconductor package 30 is now bonded to a carrier 60 at the grinded surface 103' on the first side 100A of the wafer 100, FIG. 13 shows an additional operation of thinning down the wafer 100 uniformly from the second side 100E of the wafer 100. Alternatively stated, a thickness across the wafer 100 is maintained uniform before and after the uniform thin down operation conducted at the second side 100B of the wafer 100. In some embodiments, the portion of the wafer 100 below the bottom 1012 of the trimmed recess 1001 is uniformly removed. It should be recognized that practical applications of the embodiment CoWoS device may also include other features, structures, layers, connections, and so on that have not been included in FIG. 13 for ease of illustration. For example, the semiconductor wafer 100 described herein can be replaced by an interposer having at least one through silicon via (TSV) coupling the die 101 in proximal to the first side 100A and a substrate (not shown) in proximal to a second side 100B.

Figure 15:
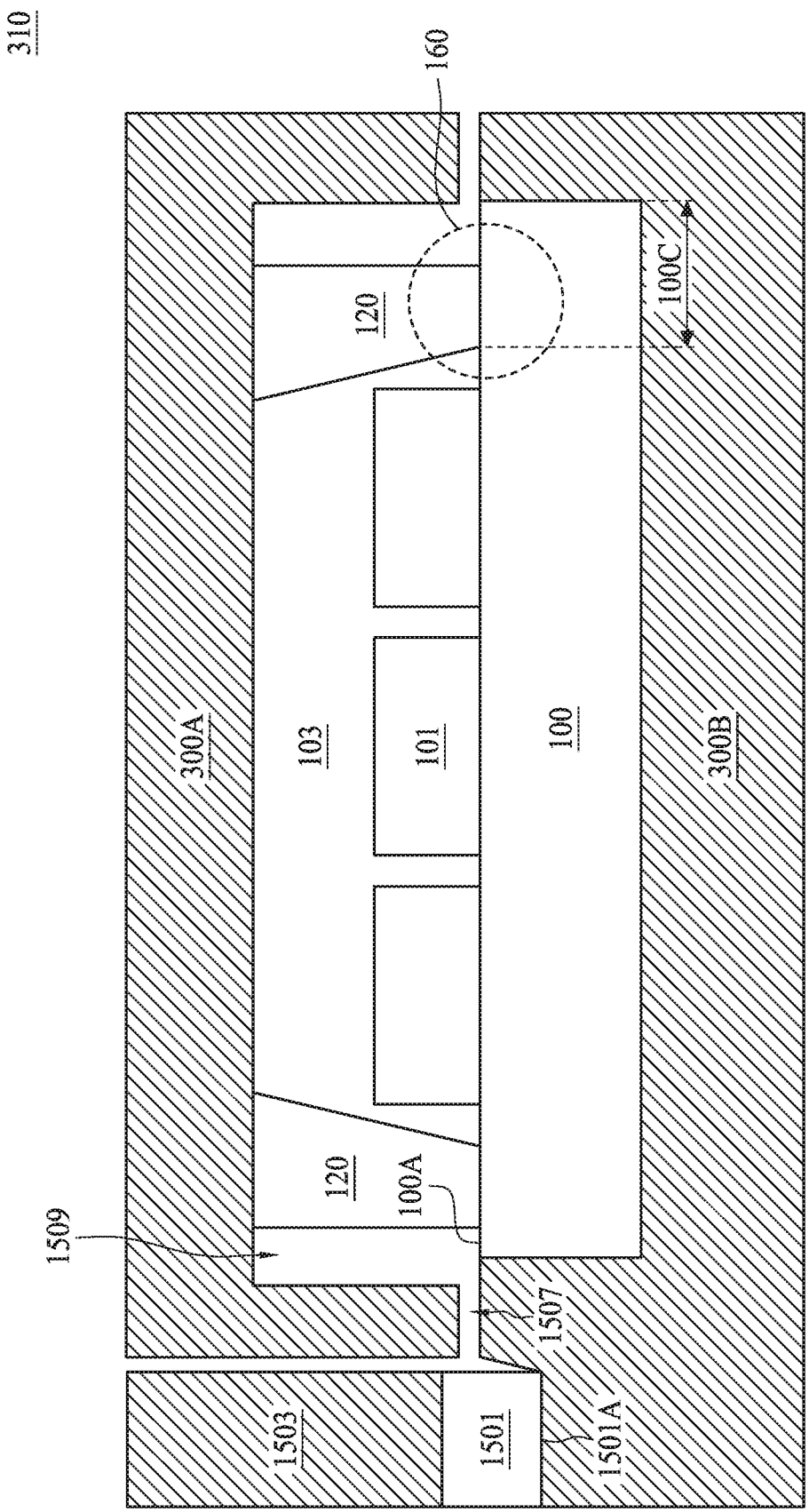

FIG. 14 to FIG. 19 are cross sectional views of a semiconductor packaged wafer in various operations of manufacturing thereof, in accordance with some embodiments of the present disclosure. FIG. 20 lists out the operations 201, 202, 203 required for the manufacturing method 200 in addressing FIG. 14 to FIG. 19. Similarly, FIG. 21 lists out the operations 211, 2.12, 213 required for the manufacturing method 200 in addressing FIG. 14 to FIG. 19. Description of FIG. 14 can be referred to previous discussion over FIG. 3 or FIG. 8 and is not repeated here for brevity. Referring to FIG. 15, after ejecting from the first molding tool 300, the semiconductor package 30 transferred to a second molding tool 301 for the second molding process. Description of the second molding tool 310 in FIG. 15 can be referred to previous discussion over the first molding tool 300 except for the molding material 1501 used in the second molding tool 310 is different from that used in the first molding tool 300. The molding material 1501 used in the second molding tool 310 is to form the sealing structure 120 surrounding the molding body 103. Compositions of the molding body 103 and the sealing structure 102 are previously discussed and can be referred thereto. As shown in FIG. 15, a molding material 1501 in a solid, pelletized form is dispensed into a heated pot 1501A, where it is quickly melted to a molten state. A close-fitting piston 1503 is then brought down forcefully into the pot 1501A and the molten molding material 1501 is thereby forced out of the pot 1501A, through the gate 1507 and into the cavity 1509 of the second molding tool 310 to form the sealing structure 120 surrounding the molding body 103. In some embodiments, the molding material 1501 does not have to be formed with a height H' same as the height H of the pre-formed molding body 103, that is, the molding material 1501 can be, for example, formed with a height H' lower than the height H of the pre-formed molding body 103. In subsequent operations, the molding material 1501 having a height H' lower than the height H of the pre-formed molding body 103 may gradually climb upward along the sidewall of the pre-formed molding body 103 due to surface tension.

The formation of the sealing structure 120 surrounding the molding body 103 can be achieved by several means. For example, the upper chase 300A having a U-shape may protrude the two legs away from the periphery 100C of the wafer 100, assuring the periphery 100C capable of accommodating molding materials 1501 applied subsequent to the molding materials 301. As illustrated in FIG. 15, the sealing structure 120 does not fully occupy the periphery 100C of the wafer 100. In some embodiments, the sealing structure 120 is formed to occupy a width less than 3.5 millimeter at the periphery 100C. However, in other embodiment, the sealing structure 120 can be controlled to fully occupy the periphery 100C of the wafer 100, for example, by quantity control of the molding materials as previously discussed.

Figure 16:
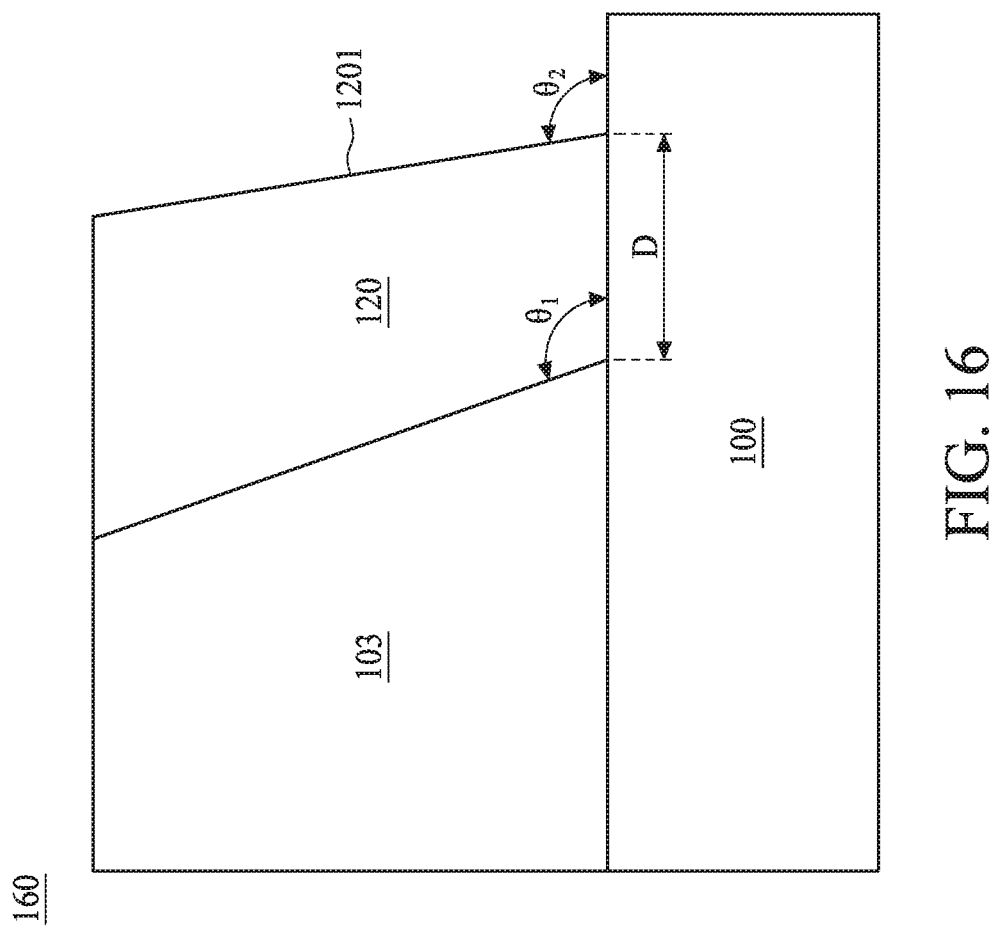
Figure 17:
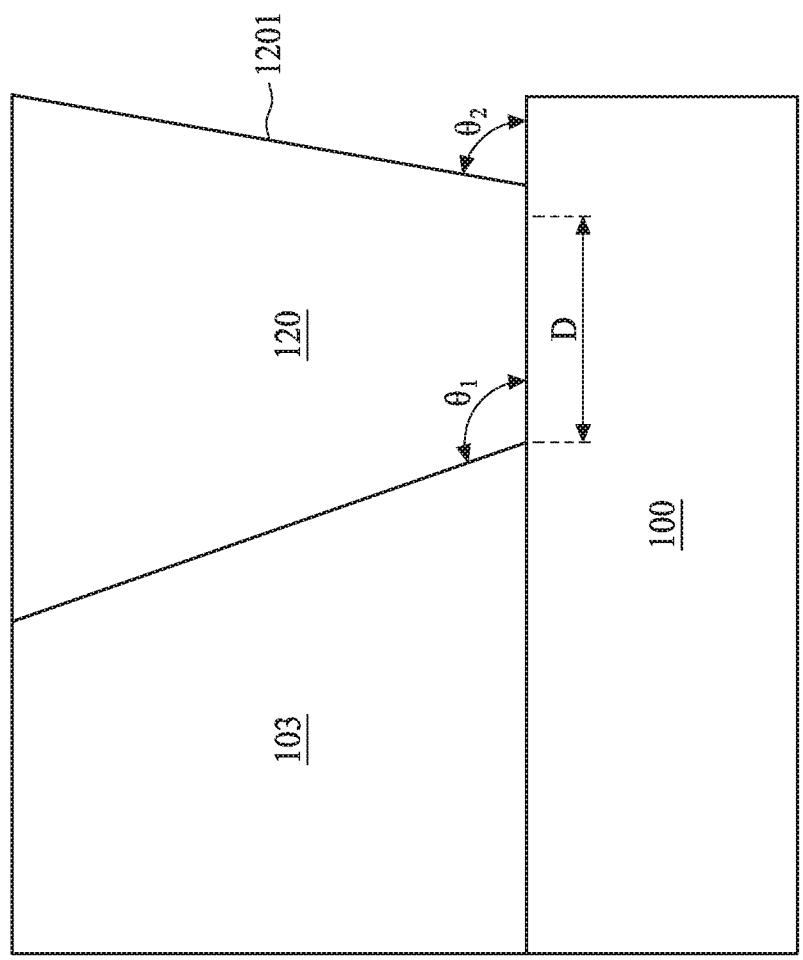
Figure 18:
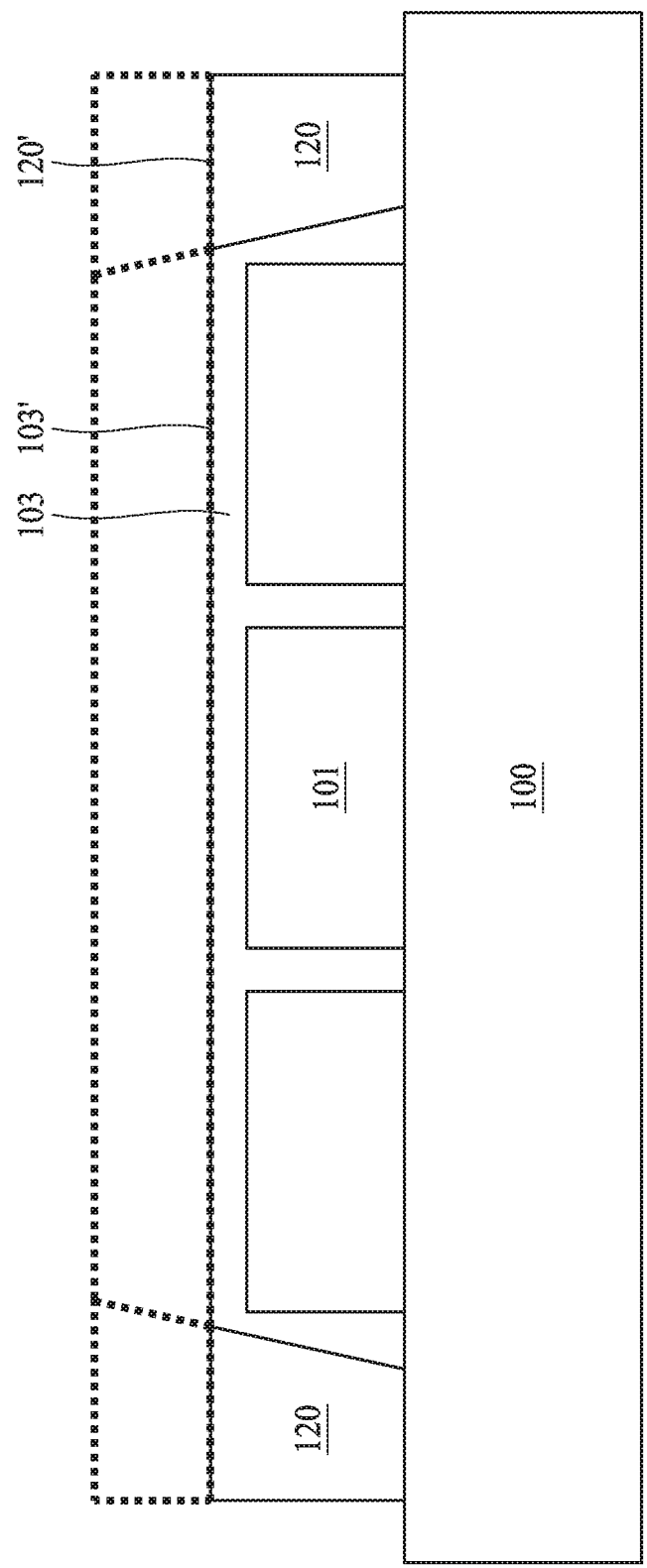

As circled by dotted lines in FIG. 15 and magnified in FIG. 16, the enlarged view 160 showing the spread and cured molding body 103 is having an angle θ1 with respect to the first surface 100A of the wafer 100 and an angle θ2 defined by the sidewall 1201 of the sealing structure 120 with respect to the first surface 100A of the wafer 100. Note the angle θ1 is defined to sweep, outside of the molding body 103, from the sidewall of the molding body 103 toward the first side 100A of the wafer 100. Note the angle θ2 is defined to sweep, outside of the sealing structure 120 from the sidewall 1201 toward the first side 100A of the wafer 100. In some embodiments, the angle θ1 can be an obtuse angle from about 90 to about 135 degrees. In some embodiments, the angle θ2 can be an obtuse angle from about 90 to about 135 degrees, as shown in FIG. 16. However, the angle θ2 can be an acute angle from about 45 to about 90 degrees, as shown in FIG. 17. An acute or obtuse angle θ2 can be determined by the quantity of the molding material 1501 and the geometry of the cavity 309 of the second molding tool 310.

As shown in FIG. 15, the molding body 103 and the sealing structure 120 are thinned down by a polishing operation to expose a grinded surface 103' and 120' in preparation to the subsequent bonding operation. Referring back to FIG. 14 and FIG. 15, since the molding materials 301 and 1501 are controlled not to cover the side edge and the second side 100B of the wafer 100, conventional trimming operation conducted over the second side 100B can be eliminated.

Figure 19:
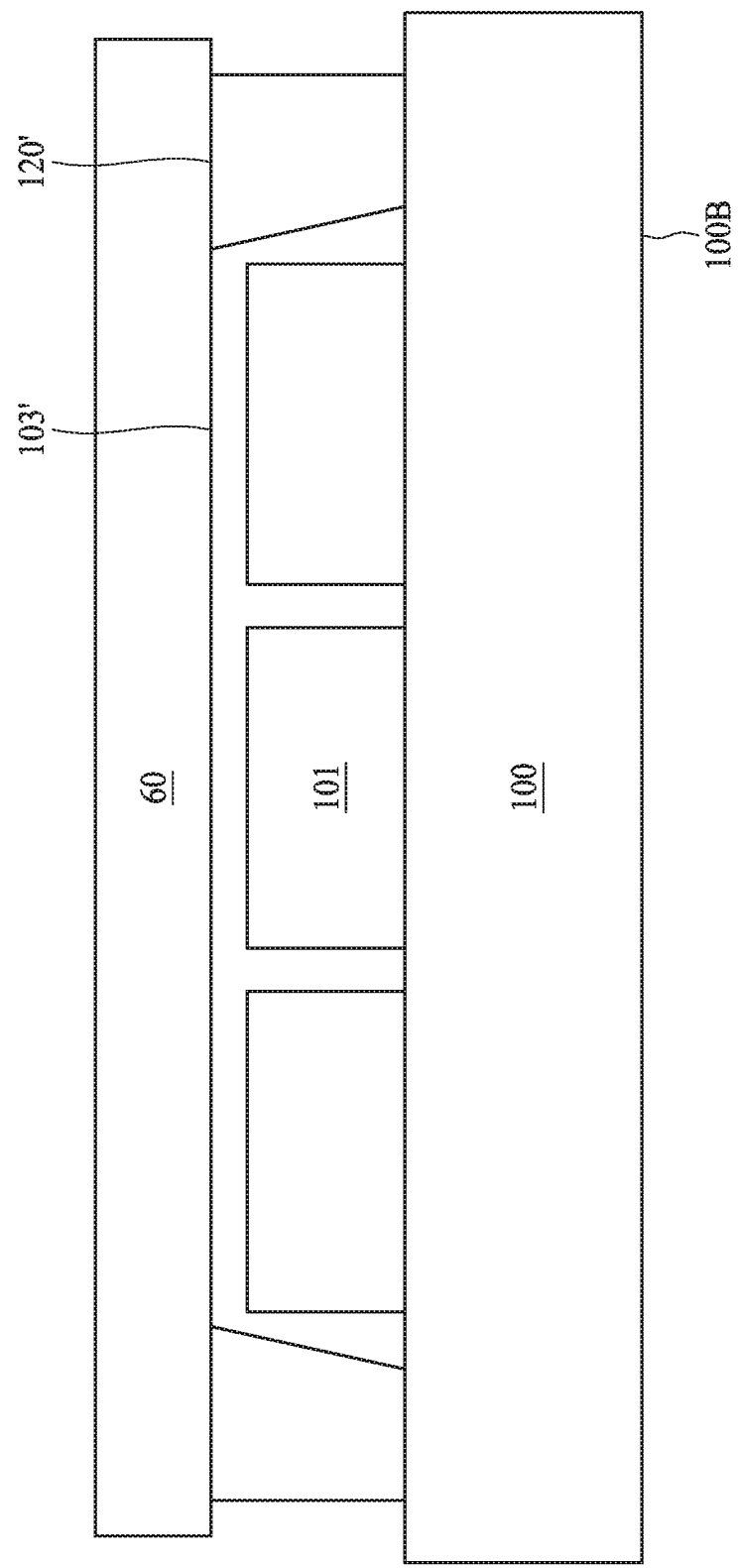

As shown in FIG. 19, the semiconductor package 30 is now bonded to a carrier 60 at the coplanar grinded surfaces 103' and 120' over the first side 100A of the wafer 100. An additional operation of thinning down the wafer 100 uniformly from the second side 100B of the wafer 100 can be conducted (not shown). Alternatively stated, a thickness across the wafer 100 is maintained uniform before and after the uniform thin down operation conducted at the second side 100B of the wafer 100. It should be recognized that practical applications of the embodiment CoWoS device may also include other features, structures, layers, connections, and so on that have not been included in FIG. 19 for ease of illustration. For example, the semiconductor wafer 100 described herein can be replaced by an interposer having at least one through silicon via (TSV) coupling the die 101 in proximal to the first side 100A and a substrate (not shown) in proximal to a second side 100B.

Some embodiments provide a method for forming a semiconductor packaged wafer, including providing a semiconductor package having a die on a first side of a wafer, partially molding the die by disposing molding material on the first side of the wafer, a peripheral of the first side is free of molding material at a completion of the partially molding, and bonding the semiconductor package with a carrier from the first side of the wafer.

Some embodiments provide a method for forming a semiconductor packaged wafer, including providing a semiconductor package having a die on a first side of a wafer, partially molding the die by a first molding tool, and bonding the semiconductor package with a carrier from the first side of the wafer. The partially molding the die by a first molding tool further includes disposing a molding material into the first molding tool and controlling the first molding material from occupying a peripheral of the first side of the wafer.

Some embodiments provide a semiconductor packaged wafer, including a die on a first side of a wafer, a molding encapsulating the die and partially positioning on the first side of the wafer by retracting from a peripheral of the first side of the wafer, and a sealing structure on the peripheral of the first side of the wafer.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor packaged wafer, comprising:
    providing a semiconductor package having a die on a first side of a wafer;
    covering a first molding tool on the first side of the wafer, wherein the first molding tool has a cavity with a first leg and a second leg protruding upon a peripheral of the first side, wherein a width between the first leg and the second leg is narrower than a width of the wafer;
    performing a wafer-level operation of partially molding the die by disposing molding material on the first side of the wafer within the cavity, the peripheral of the first side is free of molding material at a completion of the partially molding;
    forming a seal structure on the peripheral of the first side by a second molding tool, wherein a top surface of the seal structure is substantially coplanar with a top surface of the molding material;
    bonding the semiconductor package with a carrier from the first side of the wafer; and
    partially trimming the wafer by thinning the peripheral from the first side before the bonding the semiconductor package with the carrier, the partially trimming comprising rotating the wafer against a fixed saw.

2. The method of claim 1, further comprising:
trimming the wafer by thinning the wafer from a second side after the bonding the semiconductor package with the carrier, the second side is opposite to the first side.

3. The method of claim 1, further comprising:
grinding a portion of the molding material over the die before bonding the semiconductor package with the carrier.

4. The method of claim 1, wherein a portion of the first side other than the peripheral is covered by the molding material at the completion of the partially molding.

5. A method for forming a semiconductor packaged wafer, comprising:
providing a semiconductor package having a die on a first side of a wafer;
performing a wafer-level operation of partially molding the die by a first molding tool, comprising:
  disposing a molding material into the first molding tool; and
  controlling the molding material from occupying a peripheral of the first side of the wafer by having a cavity in the first molding tool narrower than a width of the wafer;
forming a seal structure on the peripheral of the first side by a second molding tool, wherein a top surface of the seal structure is substantially coplanar with a top surface of the molding material;
thinning the peripheral from the first side by rotating the wafer against a fixed saw; and
bonding the semiconductor package with a carrier from the first side of the wafer.

6. The method of claim 5, wherein thinning the peripheral from the first side is prior to bonding the semiconductor package with the carrier.

7. The method of claim 6, further comprising:
trimming the wafer by thinning the wafer from a second side after the bonding the semiconductor package with the carrier, the second side is opposite to the first side.

8. The method of claim 5, wherein the seal structure is composed of material different from the molding material.

9. The method of claim 5, wherein a width of the peripheral of the first side of the wafer is less than 5 millimeter.

10. The method of claim 5, wherein an angle between a sidewall of the molding material and the first side of the wafer after partially molding the die is in a range of from about 90 to about 135 degrees.

11. The method of claim 6, wherein the partially trimming the wafer from the first side comprises forming a recess having a depth from about 250 μm to about 500 μm.

12. The method of claim 5, wherein the seal structure comprises a width less than 3.5 millimeter.

13. The method of claim 5, wherein an angle between a sidewall of the seal structure and the first side of the wafer after forming the seal structure is less than 90 degree.

14. The method of claim 5, wherein the bonding the semiconductor package with the carrier comprises attaching the carrier with molding material and the seal structure.

15. The method of claim 5, wherein a portion of the first side other than the peripheral is covered by the molding material at the completion of the partially molding.

16. A semiconductor packaged wafer, comprising:
a plurality of dies on a first side of a wafer;
a continuous molding encapsulating the plurality of dies and partially positioning on the first side of the wafer by retracting from a peripheral of the first side of the wafer; and
a sealing structure on the peripheral of the first side of the wafer, wherein a sidewall of the sealing structure is oblique, and a top surface of the sealing structure is substantially coplanar with a top surface of the molding.

17. The semiconductor packaged wafer of claim 16, wherein a width of the peripheral is under 5 millimeter.

18. The semiconductor packaged wafer of claim 16, wherein the molding comprises thermal conducting filler.

19. The semiconductor packaged wafer of claim 16, wherein the sealing structure is composed of materials different from the molding.

20. The semiconductor packaged wafer of claim 16, wherein a sidewall of the molding is oblique.

* * * * *